United States Patent [19]

Naito

[11] Patent Number: 4,561,113
[45] Date of Patent: Dec. 24, 1985

[54] DISTORTION CANCELLER FOR FM RECEIVER

[75] Inventor: Michinori Naito, Tokyo, Japan

[73] Assignee: Trio Kabushiki Kaisha, Tokyo, Japan

[21] Appl. No.: 596,524

[22] Filed: Apr. 4, 1984

[30] Foreign Application Priority Data

Apr. 9, 1983 [JP] Japan ............................... 58-61540
Jun. 3, 1983 [JP] Japan ........................... 58-84025[U]

[51] Int. Cl.⁴ .......................... H04B 1/10; H04B 1/16
[52] U.S. Cl. .................................. 455/205; 455/305; 455/312; 381/13
[58] Field of Search ............. 455/205, 296, 303, 305, 455/306, 309, 312; 381/13, 94

[56] References Cited

U.S. PATENT DOCUMENTS

| | | | |
|---|---|---|---|
| 2,987,701 | 6/1961 | Grannemann | 455/306 |
| 4,272,846 | 6/1981 | Muratani et al. | 455/305 |
| 4,314,377 | 2/1982 | Kondo et al. | 455/305 |

*Primary Examiner*—Jin F. Ng
*Attorney, Agent, or Firm*—Murray, Whisenhunt and Ferguson

[57] ABSTRACT

In a distortion canceller to remove the distortion of a demodulated signal in an FM receiver, the n-th power of the demodulated FM signal is produced and then differentiated to derive an n-th order distortion signal. The derived n-th order distortion signal is adjusted in its amplitude level and then combined with the demodulated FM signal so that the n-th distortion component can be cancelled.

5 Claims, 7 Drawing Figures

| FIG. IA | FIG. IB |

DISTORTION CANCELLER FOR FM RECEIVER

BACKGROUND OF THE INVENTION

The present invention relates to a circuit for cancelling the distortion included in a demodulated FM signal.

Although band-pass filters are included in the front end stage and intermediate frequency amplification stage of an FM receiver, the frequency vs phase characteristics of these band-pass filters do not always have an ideal linearity. Therefore, the distortion is included in an FM demodulated signal. These frequency-band characteristics vary in dependence upon changes in circumferential conditions such as the ambient temperature, moisture, and the like, and with time.

It is an object of the present invention to provide a distortion canceller to remove the distortion in a demodulated FM signal to be caused due to a non-linearity of the frequency-band characteristics at the front end stage and intermediate frequency amplification stage.

A more specific object of the present invention is to provide a distortion canceller whereby even when the frequency-band characteristics vary, it follows its change and can cancel the distortion.

SUMMARY OF THE INVENTION

According to the invention, there is provided a distortion canceller for an FM receiver comprising: first means for producing the n-th power of a demodulated FM signal; second means for differentiating the produced n-th power of the demodulated FM signal to derive an n-th order distortion signal from the demodulated FM signal; third means for adjusting the amplitude level of the derived n-th order distortion signal; and fourth means for combining the demodulated FM signal with the level-adjusted n-th order distortion signal. In the canceller, the level-adjustment of the third means is set so that the n-th order distortion component of the demodulated FM signal can be cancelled with the derived n-th order distortion signal.

As more specific embodiment of the invention, the canceller includes a frequency-band characteristic detector. The detector derives from a pilot signal in the demodulated FM signal a control signal which represents the n-th order term of the frequency-band characteristics. The level-adjustment of the third means is performed according to the control signal from the detector so that the cancellation of the n-th order distortion can be realized even if the frequency-band characteristics vary.

BRIEF DESCRIPTION OF THE DRAWINGS

Specific embodiments of the invention have been chosen for the purpose of illustration and description, and are shown in the accompanying drawings, wherein.

DESCRIPTION OF THE PREFERRED EMBODIMENT

Figure 1:
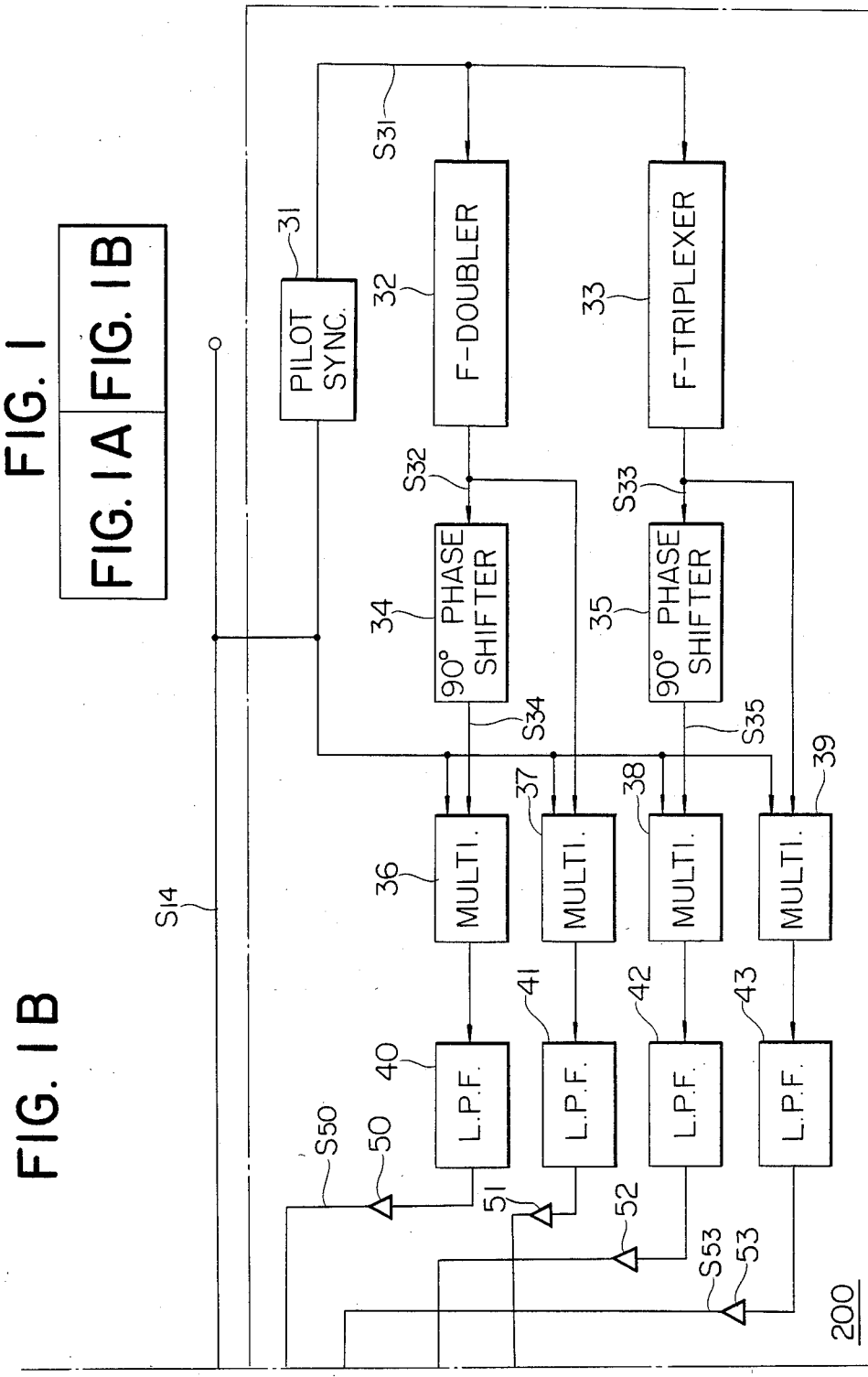
FIG. 1 consists of FIG. 1A and FIG. 1B and is a circuit diagram showing an embodiment of a distortion canceller according to the present invention.

FIG. 1 is a block diagram showing a constitution of one embodiment of the present invention.

In this embodiment, it will be described the case where the second and third harmonic distortions are cancelled.

In FIG. 1, a reference numeral 1 denotes a front end; 2 indicates an intermediate frequency (IF) stage; 3 is an FM demodulator. In this embodiment, an output of the FM demodulator 3 is supplied through a distortion canceller 100 to the next stage, e.g., stereo MPX circuit. The distortion canceller 100 is adjusted by control signals from an intermediate frequency (IF) band characteristic detecting circuit 200.

Figure 1A:
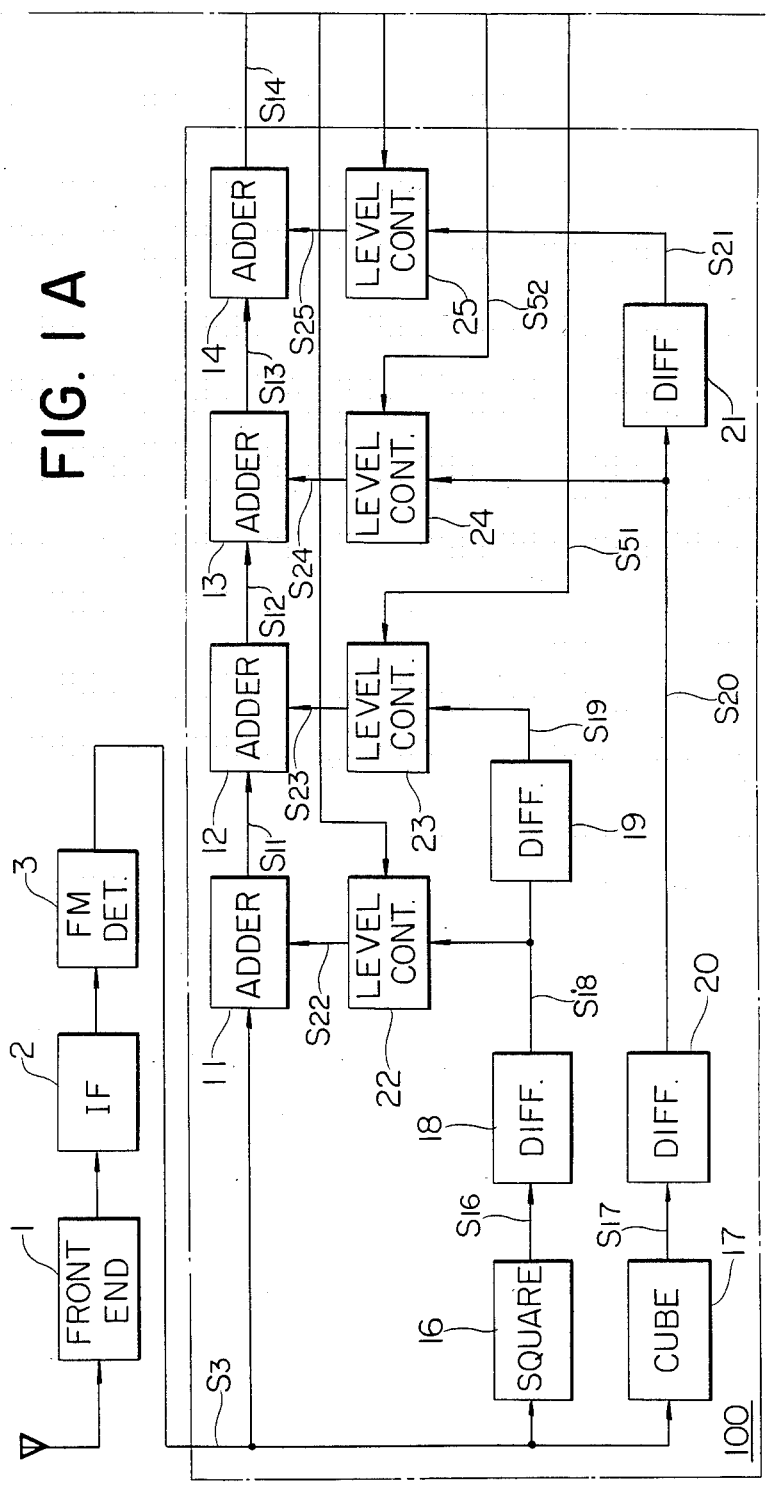

The distortion canceller 100 as shown in FIG. 1A comprises: an adder 11 to which an FM demodulated output is supplied; a square multiplier 16 and a cubic multiplier 17; a differentiator 18 for differentiating an output of the square multiplier 16; a differentiator 19 for differentiating an output of the differentiator 18; a differentiator 20 for differentiating an output of the cubic multiplier 17; a differentiator 21 for differentiating an output of the differentiator 20; a level controller 22 for adjusting the output level of the differentiator 18 and supplying the output thereof to the adder 11; a level controller 23 for adjusting the output level of the differentiator 19; an adder 12 for adding an output of the adder 11 and an output of the level controller 23; a level controller 24 for adjusting the output level of the differentiator 20; an adder 13 for adding an output of the adder 12 and an output of the level controller 24; a level controller 25 for adjusting the output level of the differentiator 21; and an adder 14 for adding an output of the adder 13 and an output of the level controller 25.

The action of the distortion canceller 100 constituted in the manner as described above will now be described. Assuming that a modulation signal is $\Delta\Omega\cos\omega t$, an FM demodulated output $S_3$ to be output from the FM demodulator 3 will be expressed by $$S_3 = \Delta\Omega\cos\omega t + k_1\omega\Delta\omega^2 \sin 2\omega t + l_1\omega^2\Delta\Omega^2 \cos 2\omega t + m_1\omega\Delta\Omega^3 \sin 3\omega t + n_1\omega^2\Delta\Omega^3 \cos 3\omega t \quad (1)$$

The above expression (1) indicates until the third harmonic distortion component. In this expression (1), $k_1$, $l_1$, $m_1$, and $n_1$ are constants to be determined in dependence upon the frequency-band characteristics of the IF stage 2 and it is assumed that $|k_1| \ll 1$, $|l_1| \ll 1$, $|m_1| \ll 1$, and $|n_1| \ll 1$. In addition, $\Delta\Omega$ represents an amplitude of the modulation signal.

The FM demodulated output $S_3$ is supplied to the square multiplier 16 and cubic multiplier 17 and is respectively squared and cubed; however, since the constants are such that $|k_1| \ll 1$, $|l_1| \ll 1$, $|m_1| \ll 1$, and $|n_1| \ll 1$, it may be considered that only the first term of the FM demodulated output $S_3$ is squared and cubed.

Therefore, outputs $S_{16}$ and $S_{17}$ of the square multiplier 16 and cubic multiplier 17 will be $$S_{16} = (\Delta\Omega\cos\omega t)^2 = \Delta\Omega^2(\tfrac{1}{2} + \tfrac{1}{2}\cos 2\omega t) \quad (2)$$

$$\begin{aligned}S_{17} &= (\Delta\Omega\cos\omega t)^3 \\ &= \Delta\Omega^3(\tfrac{1}{2}\cos\omega t + \tfrac{1}{2}\cos 2\omega t \cos\omega t) \\ &= \Delta\Omega^3(\tfrac{3}{4}\cos\omega t + \tfrac{1}{4}\cos 3\omega t) \\ &\approx \tfrac{1}{4}\Delta\Omega^3 \cos 3\omega t \end{aligned} \quad (3)$$

On the other hand, since the fundamental component of $\cos\omega t$ is irrelevant when deriving the distortion component, it is ommitted in expression (3).

Outputs $S_{18}$ and $S_{19}$ of the differentiators 18 and 19 are $$S_{18} = S_{16}' = -\omega\Delta\Omega^2 \sin 2\omega t \tag{4}$$

$$S_{19} = S_{18}' = -2\omega^2\Delta\Omega^2 \cos 2\omega t \tag{5}$$

Outputs $S_{20}$ and $S_{21}$ of the differentiators 20 and 21 are $$S_{20} = S_{17}' = -\tfrac{3}{4}\omega\Delta\Omega^3 \sin 3\omega t \tag{6}$$

$$S_{21} = S_{20}' = -9/4\omega^2\Delta\Omega^3 \cos 3\omega t \tag{7}$$

Assuming that the input/output levels of the level controllers 22 to 25 are respectively k, l, m and n, outputs $S_{22}$, $S_{23}$, $S_{24}$ and $S_{25}$ of the level controllers 22, 23, 24 and 25 will be $$S_{22} = kS_{18} = k\omega\Delta\Omega^2 \sin 2\omega t \tag{8}$$
$$S_{23} = lS_{19} = -2l\omega^2\Delta\Omega^2 \cos 2\omega t \tag{9}$$
$$S_{24} = mS_{20} = -\tfrac{3}{4}m\omega\Delta\Omega^3 \sin 3\omega t \tag{10}$$
$$S_{25} = nS_{21} = -\tfrac{9}{4}n\omega^2\Delta\Omega^3 \cos 3\omega t \tag{11}$$

Therefore, outputs $S_{11}$, $S_{12}$, $S_{13}$ and $S_{14}$ of the adders 11, 12, 13 and 14 will be $$\begin{aligned}
S_{11} &= S + S_{22} \\
&= \Delta\Omega\cos\omega t + (k_1 - k)\omega\Delta\Omega^2 \sin 2\omega t \\
&\quad + l_1\omega^2\Delta\Omega^2\cos 2\omega t + m_1\omega\Delta\Omega^3\sin 3\omega t \\
&\quad + n_1\omega^2\Delta\Omega^3\cos 3\omega t
\end{aligned} \tag{12}$$

$$\begin{aligned}
S_{12} &= S_{11} + S_{23} \\
&= \Delta\Omega\cos\omega t + (k_1 - k)\omega\Delta\Omega^2\sin 2\omega t \\
&\quad + (l_1 - 2l)\omega^2\Delta\Omega^2\cos 2\omega t + m_1\omega\Delta\Omega^3\sin 3\omega t \\
&\quad + n_1\omega^2\Delta\Omega^3\cos 3\omega t
\end{aligned} \tag{13}$$

$$\begin{aligned}
S_{13} &= S_{12} + S_{24} \\
&= \Delta\Omega\cos\omega t + (k_1 - k)\omega\Delta\Omega^2\sin 2\omega t \\
&\quad + (l_1 - 2l)\omega^2\Delta\Omega^2\cos 2\omega t \\
&\quad + (m_1 - \tfrac{3}{4}m)\omega\Delta\Omega^3\sin 3\omega t \\
&\quad + n_1\omega^2\Delta\Omega^3\cos 3\omega t
\end{aligned} \tag{14}$$

$$\begin{aligned}
S_{14} &= S_{13} + S_{25} \\
&= \Delta\Omega\cos\omega t + (k_1 - k)\omega\Delta\Omega^2\sin 2\omega t \\
&\quad + (l_1 - 2l)\omega^2\Delta\Omega^2\cos 2\omega t \\
&\quad + (m_1 - \tfrac{3}{4}m)\omega\Delta\Omega^3\sin 3\omega t \\
&\quad + \left(n_1 - \tfrac{9}{4}n\right)\omega^2\Delta\Omega^3\cos 3\omega t.
\end{aligned} \tag{15}$$

When the level ratios k, l, m and n are set to be such that $k = k_1$, $l = \tfrac{1}{2}l_1$, $m = 4/3 m_1$ and $n = 4/9 n_1$, the second, third and fourth terms in expression (15) become zero and output $S_{14} = \Delta\Omega t \cos\omega t$ so that it is possible to obtain the output without distortion component from the distortion canceller 100.

In addition, the addition sequence of the adders 11 to 14 may be changed as is obvious from expressions (12)–(15).

Figure 2:
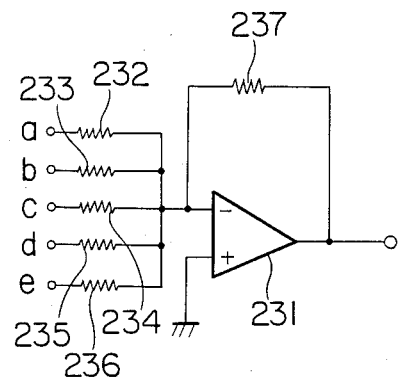
FIG. 2 shows a practical example of an adder which is used in the circuit of FIG. 1.

For example, as shown in FIG. 2, the adders 11–14 which constitute a part of the above-described distortion canceller 100 may be constituted by a well-known adding circuit consisting of an arithmetic amplifier 231, resistors 232–236, and a feedback resistor 237; resistance values of the resistors 232–236 and feedback resistor 237 are made equal; and the FM demodulated output $S_3$ is supplied to an input terminal a and the outputs $S_{22}$, $S_{23}$, $S_{24}$ and $S_{25}$ of the level controllers 22, 23, 24 and 25 are individually supplied to input terminals b, c, d and e, respectively, thereby enabling the addition to be performed. This arrangement enables the adders 11–14 to be constituted by one adding circuit.

Figure 3:
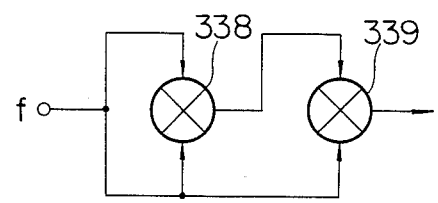
FIG. 3 shows a practical example of a cubic multiplier which is used in the circuit of FIG. 1.

In addition, for instance as shown in FIG. 3, the cubic multiplier 17 may consist of an analog multipliers 338 and 339 and may be constituted so that the input supplied to an input terminal f is multiplied by the multiplier 338 and an output of the multiplier 338 and the input supplied to the input terminal f are multiplied by the multiplier 339.

On the other hand, the square multiplier 16 may be constituted by only the analog multiplier 338 shown in FIG. 3.

Figure 4:
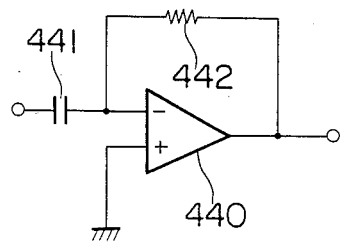
FIG. 4. shows a practical example of a differentiating circuit which is used in the circuit of FIG. 1.

Also, the respective differentiators 18–21 may be constituted by a well-known differentiating circuit consisting of a resistor and a capacitor, or may be constituted by a well-known differentiating circuit consisting of an arithmetic amplifier 440, a capacitor 441 and a resistor 442 as shown in FIG. 4.

Figure 5:
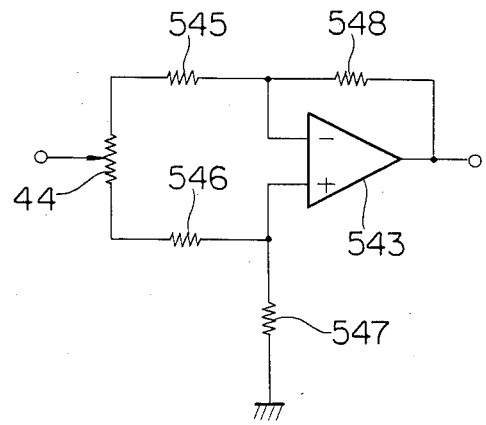
FIG. 5 shows a practical example of a level control circuit which is used in the circuit of FIG. 1.

On one hand, for example as shown in FIG. 5, the level controllers 22–25 may be constituted by an arithmetic amplifier 543, a variable resistor 544, resistors 545–547, and a feedback resistor 548 and the non-inverted input voltage and inverted input voltage of the arithmetic amplifier 543 are varied depending upon the position of the slidable contacting member of the variable resistor 544. It is accordingly possible to derive the outputs having the different amplitudes and polarities from an output terminal of the arithmetic amplifier 543. Therefore, the level ratios k, l, m and n can be set in accordance with the values of constants $k_1$, $l_1$, $m_1$ and $n_1$, and the invention can be applied even in the case where the constants $k_1$, $l_1$, $m_1$ and $n_1$ are negative values due to the frequency-band characteristics of the IF stage.

The suitable setting of the level ratios of the level controllers 22–25 in the distortion canceller 100 of the present invention enables the distortion to be caused due to the frequency-band characteristics of the front end stage and IF amplification stage to be reduced; however, these frequency-band characteristics vary depending upon a change in ambient environment such as temperature, moisture, or the like and with time. Consequently, even if the receiver has been once set into the state of minimum distortion, this state will not be always maintained. The distortion characteristic detecting circuit 200 shown in FIG. 1 intends to derive a control signal representing the frequency-band characteristics from a pilot signal $S_p$ of the FM stereo signal which was subjected to distortion, thereby always adjusting the level ratios of the level controllers 22–25 in the distortion canceller 100 into optimum values according to this control signal.

The frequency-band characteristic detecting circuit 200 shown in FIG. 1B comprises: a sync signal generator 31 consisting of a PLL circuit to which the output of the adder 14 is supplied and which generates the output of a constant amplitude synchronized with the pilot signal in the output of the adder 14; a doubler circuit 32 and a triplexer circuit 33 to individually respectively double and triple the output frequency of the sync signal generator 31; a phase shifter 34 for shifting an output of the doubler circuit 32 by 90 degrees; a phase shifter 35 for shifting an output of the triplexer circuit 33 by 90 degrees; a multiplier 36 and a low-pass filter 40 for synchro-detecting the output of the adder 14 by an output of the phase shifter 34; a multiplier 37 and a low-pass filter 41 for synchro-detecting the output of the adder 14 by the output of the doubler circuit 32; a multiplier 38 and a low-pass filter 42 for synchro-detecting the output of the adder 14 by an output of the phase shifter 35; and a multiplier 39 and a low-pass filter 43 for synchro-detecting the output of the adder 14 by an output of the triplexer circuit 33. Outputs of the low-pass filters 40, 41, 42 and 43 are respectively individually supplied as level control signals to the level controllers 22, 23, 24 and 25 through DC amplifiers 50, 51, 52 and 53.

Although the FM stereo broadcast has the modulation frequency of up to 53 kHz, the pilot signal $S_p$ is always included therein.

The pilot signal $S_p$ is represented by $$S_p = \Delta\Omega_p \cos pt$$

where, $\Delta\Omega_p$ denotes an amplitude of the pilot signal and p indicates an angular frequency of the pilot signal.

When an attention is paid to the pilot signal $S_p$, its demodulated output $S_{3p}$ can be expressed by $$S_{3p} = \Delta\Omega_p \cos pt + k_{1p}\Delta\Omega_p{}^2 \sin 2pt + l_{1p}{}^2\Delta\Omega_p{}^2 \cos 2p^t + m_{1p}\Delta\Omega_p{}^3 \sin 3pt + n_{1p}{}^2\Delta\Omega_p{}^3 \cos 3pt.$$

Now, assuming that the outputs of the level controllers 22-25 are zero, the output $S_{14}$ of the adder 14 will be equal to the FM demodulated output $S_3$, i.e., $S_{14} = S_3$.

On the other hand, an output $S_{31}$ of the sync signal generator 31, an output $S_{32}$ of the doubler circuit 32, an output $S_{33}$ of the triplexer circuit 33, an output $S_{34}$ of the phase shifter 34, and an output $S_{35}$ of the phase shifter 35 are $$S_{31} = \cos pt,$$
$$S_{32} = \cos 2pt,$$
$$S_{33} = \cos pt,$$
$$S_{34} = \sin 2pt \text{ and}$$
$$S_{35} = \sin 3pt.$$

The DC components are extracted from outputs of the multipliers 36, 37, 38, and 39 through the low-pass filters 40, 41, 42, and 43, respectively, and are amplified by the DC amplifiers 50, 51, 52, and 53. Outputs $S_{50}$, $S_{51}$, $S_{52}$, and $S_{53}$ of the DC amplifiers 50-53 are $$S_{50} = [S_{14} \times S_{34}] \text{ DC component} = \tfrac{1}{2} k_1 p \Delta\Omega_p{}^2,$$

$$S_{51} = [S_{14} \times S_{32}] \text{ DC component} = \tfrac{1}{2} l_1 p^2 \Delta\Omega_p{}^2,$$

$$S_{52} = [S_{14} \times S_{35}] \text{ DC component} = \tfrac{1}{2} m_1 p \Delta\Omega_p{}^3, \text{ and}$$

$$S_{53} = [S_{14} \times S_{33}] \text{ DC component} = \tfrac{1}{2} n_1 p^2 \Delta\Omega_p{}^3$$

Now, since p is $[2\pi \times 19 \text{ kHz}]$ and $\Delta\Omega_p$ is a constant value, when it is assumed that $$S_{50} = G_1 k_1, \text{ where } G_1 = \tfrac{1}{2} p \Delta\Omega_p{}^2,$$

$$S_{51} = G_2 l_1, \text{ where } G_2 = \tfrac{1}{2} p^2 \Delta\Omega_p{}^2,$$

$$S_{52} = G_3 m_1, \text{ where } G_3 = \tfrac{1}{2} p \Delta\Omega_p{}^3 \text{ and}$$

-continued $$S_{53} = G_4 n_1, \text{ where } G_4 = \tfrac{1}{2} p^2 \Delta\Omega_p{}^3.$$

It will be appreciated that $S_{50}$–$S_{53}$ are the outputs responsive to the changes of the constants $k_1$, $l_1$, $m_1$, and $n_1$ to be determined due to the frequency-band characteristics of the front end 1 and IF stage 2.

The control signals $S_{50}$, $S_{51}$, $S_{52}$ and $S_{53}$ are respectively applied to the level controllers 22-25 and the products with $S_{18}$–$S_{21}$ shown in expressions (4)–(7) are derived. Thus, the outputs $S_{22}$, $S_{23}$, $S_{24}$, and $S_{25}$ of the level controllers 22, 23, 24, and 25 will be $$S_{22} = (S_{18} \times S_{50}) = -G_1 k_1 \omega \Delta\Omega^2 \sin 2\omega t,$$

$$S_{23} = (S_{19} \times S_{51}) = -2G_2 l_1 \omega^2 \Delta^2 \Delta\Omega^2 \cos 2\omega t,$$

$$S_{24} = (S_{20} \times S_{52}) = -\tfrac{3}{4} G_3 m_1 \omega \Delta\Omega^3 \sin 3\omega t, \text{ and}$$

$$S_{25} = (S_{21} \times S_{53}) = -\tfrac{9}{4} G_4 n_1 \omega^2 \Delta\Omega^3 \cos 3\omega t.$$

The outputs $S_{22}$, $S_{23}$, $S_{24}$, and $S_{25}$ are added to expression (1) by the adders 11, 12, 13, and 14.

Since the control signals to be supplied to the respective level controllers 22, 23, 24, and 25 form the closed loop, the fundamental angular frequency $\omega$ component of the FM demodulated output $S_3$ represented by expression (1) remains as it is, and the distortion components are respectively increased by $1/(1+G_1)$, $1/(1+2G_2)$, $1/(1+\tfrac{3}{4}G_3)$, and $1/(1+9/4\,G_4)$ times, so that the outputs $S_{14}$ of the adder 14 can be expressed by $$S_{14} = \Delta\Omega\cos\omega t + \frac{1}{1+G_1} k_1\omega\Delta\Omega^2\sin2\omega t \qquad (16)$$

$$+ \frac{1}{1+2G_2} l_1\omega^2\Delta\Omega^2\cos2\omega t$$

$$+ \frac{1}{1+\tfrac{3}{4}G_3} m_1\omega\Delta\Omega^3\sin3\omega t$$

$$+ \frac{1}{1+\tfrac{9}{4}G_4} n_1\omega^2\Delta\Omega^3\cos3\omega t.$$

Therefore, it will be appreciated that the setting of $G_1$–$G_4$ into sufficiently large values enables the distortion components in the FM demodualted output to be sufficiently suppressed.

In FIG. 1, the constants $G_1$–$G_4$ can be arbitrarily set into large values by connecting the DC amplifiers 50-53 to the respective outputs of the low-pass filters 40-43. As a result, the distortion components in the output $S_{14}$ of the adder 14 are suppressed.

As is obvious from expression (16), the addition sequence of the adders 11-14 may be changed.

In addition, in one embodiment of the present invention described above, it has been described an example in the case where the distortion components of up to the third harmonic distortion in the FM demodulated output are cancelled; however, the distortion components of up to the further high-order harmonic distortion can be cancelled by expanding one embodiment of the invention shown in FIG. 1.

On the other hand, although the case has been described whereby the distortions of a general FM demodulated output based on expression (1) are removed in the embodiment of the present invention described above, the distortions to be caused due to the frequency-band characteristics of the front end 1 and IF stage 2 include the two cases depending upon the frequency-band characteristics: one is the case where the distortion component of the phase of 90° for the fundamental wave, i.e., the sine term in expression (1) is predominant; and the other is the case where the in-phase distortion component for the fundamental wave, i.e., the cosine term in expression (1) is predominant. In such a case, even if only the predominant distortion components are removed, a large distortion reduction effect will be derived. In addition, for instance, in case of removing only the second harmonic distortion component from the FM demodulated output, the cubic multiplier 17, differentiators 20 and 21, level controllers 24 and 25, adders 13 and 14, triplexer circuit 33, phase shifter 35, multipliers 38 and 39, and low-pass filters 42 and 43 may be omitted from one embodiment of the present invention. On the other hand, in case of removing only the third harmonic distortion component from the FM demodulated output, the square multiplier 16, differentiators 18 and 19, level controllers 22 and 23, adders 11 and 12, doubler circuit 32, phase shifter 34, multipliers 36 and 37, and low-pass filters 40 and 41 may be omitted from one embodiment of the invention. Also, in case of removing only the distortion component of the phase of 90° for the fundamental wave, the differentiators 19 and 21, level controllers 23 and 25, adders 12 and 14, multipliers 37 and 39, and low-pass filters 41 and 43 may be similarly omitted from one embodiment of the invention. Furthermore, in case of removing only the in-phase distortion component for the fundamental wave, the level controllers 22, 24, adders 11, 13, phase shifters 34, 35, multipliers 36, 38, and low-pass filters 40, 42 may be likewise omitted from one embodiment of the invention.

In addition, although it has been shown an example in the case where the input of the frequency-band characteristic detecting circuit 200 is detected from the output side of the distortion canceller 100 in one embodiment of the invention, it may be fetched from the input side of the distortion canceller 100. In this case, since the closed loop is not formed, the stability of the distortion cancellation is inferior than that in the case where the closed loop is formed; however, an effect of a certain degree can be derived.

I claim:

1. A distortion canceller for an FM receiver comprising:
   first means for producing the n-th power of a demodulated FM signal, where n is a number greater than one;
   second means for differentiating the produced n-th power of the demodulated FM signal to derive an n-th order distortion signal from the demodulated FM signal;
   third means for adjusting the amplitude level of the derived n-th order distortion signal; and
   fourth means for combining the demodulated FM signal with the level-adjusted n-th order distortion signal,
   the level adjustment of the third means being set so that the n-th order distortion component of the demodulated signal and the derived n-th order distortion signal are cancelled by said fourth means.

2. A distortion canceller according to claim 1, wherein said second means includes two differentiators in cascade connection, one deriving a sine component of the n-th order distortion and the other a cosine component of the n-th order distortion.

3. A distortion canceller according to claim 1, further comprising fifth means for detecting frequency-band characteristics in the FM receiver which causes the demodulated FM signal to be distorted, and controlling the setting of the level-adjustment of said third means, the fifth means comprising:
   a first circuit for producing a frequency signal, the frequency of which is n times the frequency of a pilot signal in a demodulated FM signal,
   a second circuit for multiplying the demodulated FM signal with the frequency signal, and
   a third circuit for extracting a DC component out of the multiplication signal from the second circuit to produce a control signal for the level-adjustment of said third means.

4. A distortion canceller according to claim 3, wherein said third means multiplies the derived n-th order distortion signal with the control signal from the fifth means.

5. A distortion canceller according to claim 4, wherein the demodulated FM signal to be multiplied in said second circuit is a signal combined in said fourth means.

* * * * *